US006394835B1

(12) United States Patent
Milner et al.

(10) Patent No.: US 6,394,835 B1
(45) Date of Patent: May 28, 2002

(54) WIRING UNIT WITH PAIRED IN-LINE INSULATION DISPLACEMENT CONTACTS

(75) Inventors: John J. Milner, Milford; Richard A. Fazio, Old Lyme; Robert A. Aekins, Branford, all of CT (US)

(73) Assignee: Hubbell Incorporated, Orange, CT (US)

( * ) Notice: Subject to any disclaimer, the term of this patent is extended or adjusted under 35 U.S.C. 154(b) by 0 days.

(21) Appl. No.: 09/250,187

(22) Filed: Feb. 16, 1999

(Under 37 CFR 1.47)

(51) Int. Cl.[7] .............................. H01R 4/24; H01R 4/26; H01R 11/20
(52) U.S. Cl. ...................... 439/404; 439/676; 439/941
(58) Field of Search ................................ 439/404, 676, 439/941

(56) References Cited

U.S. PATENT DOCUMENTS

| | | | |
|---|---|---|---|
| 4,820,192 A | * 4/1989 | Denkmann et al. ......... | 439/404 |
| 4,975,078 A | 12/1990 | Stroede et al. | |
| 5,096,442 A | * 3/1992 | Arnett et al. ............... | 439/676 |
| 5,186,647 A | 2/1993 | Denkmann et al. | |
| 5,226,835 A | 7/1993 | Baker, III et al. | |
| 5,228,872 A | 7/1993 | Liu | |
| 5,299,956 A | 4/1994 | Brownell et al. | |
| 5,304,074 A | * 4/1994 | Andre et al. ................ | 439/676 |
| 5,310,363 A | 5/1994 | Brownell et al. | |
| 5,326,284 A | 7/1994 | Bohbot et al. | |
| 5,362,257 A | 11/1994 | Neal et al. | |
| 5,399,107 A | 3/1995 | Gentry et al. | |
| 5,454,738 A | 10/1995 | Lim et al. | |
| 5,562,479 A | 10/1996 | Pallas et al. | |
| 5,580,270 A | 12/1996 | Pantland et al. | |
| 5,586,914 A | 12/1996 | Foster, Jr. et al. | |
| 5,628,647 A | 5/1997 | Rohrbaugh et al. | |
| 5,743,750 A | * 4/1998 | Sullivan et al. ............. | 439/941 |
| 5,762,518 A | * 6/1998 | Tanigawa et al. ........... | 439/676 |
| 5,911,602 A | * 6/1999 | Vaden ......................... | 439/676 |
| 5,915,989 A | * 6/1999 | Adriaenssens et al. ...... | 439/404 |
| 5,941,734 A | * 8/1999 | Ikeda et al. .................. | 439/676 |
| 5,947,772 A | * 9/1999 | Arnett et al. ................ | 439/676 |
| 6,120,330 A | * 9/2000 | Gwiazdowski .............. | 439/676 |
| 6,126,476 A | * 10/2000 | Viklund et al. .............. | 439/404 |
| 6,193,526 B1 | * 2/2001 | Milner et al. ................ | 439/676 |

OTHER PUBLICATIONS

Hubbell Premise Wiring, Inc. New Edition Full Line Catalog #1100R.

* cited by examiner

Primary Examiner—Brian Sircus
Assistant Examiner—Hae Moon Hyeon
(74) Attorney, Agent, or Firm—Mark S. Bicks; Alfred N. Goodman

(57) ABSTRACT

A wire connecting unit for an electrical connector includes a printed circuit board and four pairs of terminals. The printed circuit board has nose and termination areas, and a wire receiving passageway extending along an axis in the termination area. Contact connections are mounted in the nose area. Terminal connections are mounted in the termination area. Conductive paths on the circuit board electrically couple respective contact connections and terminal connections. Each of the terminals has a coupling portion mechanically and electrically coupled through one of the terminal connections, and has a insulation displacement contact portion. Each insulation displacement contact portion is adjacent the wire receiving passageway. The terminals of each pair have spacings between them which are smaller than the spacings between the pairs.

20 Claims, 2 Drawing Sheets

WIRING UNIT WITH PAIRED IN-LINE INSULATION DISPLACEMENT CONTACTS

REFERENCE TO RELATED APPLICATION

This application is related to U.S. patent application Ser. No. 09/250,186, filed concurrently herewith in the names of John J. Milner, Joseph E. Dupuis, Richard A. Fazio and Robert A. Aekins, and entitled Wiring Unit With Paired Angled Insulation Displacement Contacts, the subject matter of which is hereby incorporated by reference.

FIELD OF THE INVENTION

The present invention relates to a wiring unit for an electrical connector or an electrical connector with a wiring unit. The wiring unit has insulation displacement contacts for electrically and mechanically connecting insulated wires to the connector. More particularly, the present invention relates orienting the insulation displacement contacts in line and in separated pairs for connection to wires arranged in unshielded twisted pairs for telecommunication and data transmission wiring systems.

BACKGROUND OF THE INVENTION

Due to significant advancements in telecommunications and data transmission speeds over unshielded twisted pair cables, the connectors (jacks, patch panels, cross connects, etc.) have become critical factors in achieving high performance in data transmission systems, particularly at the higher frequencies. Some performance characteristics, particularly near end crosstalk and impedance, can degrade beyond acceptable levels at new, higher frequencies in the connectors unless adequate precautions are taken.

Often, wiring is pre-existing. Standards define the geometry and the pin definitions for the connectors, making any changes to the wiring and to the connector geometry and pin definitions for improving performance characteristics cost prohibitive.

The use of unshielded twisted pair wiring and the establishment of certain standards for connector geometry and pin definitions were created prior to the need for high speed data transmissions. Thus, while using the existing unshielded twisted pair wiring and complying with the existing standards, connectors must be developed that fulfill the performance requirements of today's higher speed communications, in order to maintain compatibility with the existing connectors.

Conventional connectors of this type are disclosed in U.S. Pat. No. 4,975,078 to Stroede, U.S. Pat. No. 5,186,647 to Denkmann et al, U.S. Pat. No. 5,228,872 to Liu, U.S. Pat. No. 5,376,018 to Davis et al, U.S. Pat. No. 5,580,270 to Pantland et al, U.S. Pat. No. 5,586,914 to Foster et al and U.S. Pat. No. 5,628,647 to Roharbaugh et al, the subject matter of each of which is hereby incorporated by reference.

SUMMARY OF THE INVENTION

An object of the present invention is to provide a wiring unit for an electrical connector or an electrical connector with insulation displacement contacts with improved performance characteristics, but without shielding and without changing standard connector geometry and pin definitions.

Another object of the present inventions is to provide a wiring unit for an electrical connector and an electrical connector which is simple and inexpensive to manufacture and use.

A further object of the present invention is to provide a wiring unit for an electrical connector and an electrical connector with insulation displacement contacts arranged to facilitate installation of the wires into the contacts.

The foregoing objects are basically obtained by a wire connecting unit for an electrical connector comprising a printed circuit board and four pairs of terminals. The printed circuit board has first and second areas and a wiring receiving passageway extending along an axis in the second area. Contact connections are mounted in the first area. Terminal connections are mounted in the second area. Conductive paths on the circuit board electrically couple respective contact connections and terminal connections. The terminals are arranged in first, second, third and fourth pairs. Each of the terminals has a coupling portion mechanically and electrically connected to one of the terminal connections, and has a insulation displacement contact portion. Each contact portion is adjacent the wiring receiving passageway. The terminals of each of the pairs have spacings between one another smaller than spacings between the respective pairs.

By forming the wire connecting unit for the electrical connector in this manner, the connector will have improved performance characteristics, without shielding and without changing the standard connector geometry and pin definitions. The spacial orientation of the terminals in distinct pairs enhances the electrical performance, particularly near end crosstalk and impedance performance.

The terminal orientation and spacing increases efficiency in the termination process. The spacing enables wire lacing into a pre-termination position to allow quicker termination. The orientation also allows the wires to be oriented side-by-side in the same plane both before and after termination. Such planar orientation increases termination efficiency by enabling the overall termination to be visually observed for correctness directly from above the termination.

Other objects, advantages and salient features of the present invention will become apparent from the following detailed description, which, taken in conjunction with the annexed drawings, discloses a preferred embodiment of the present invention.

BRIEF DESCRIPTION OF THE DRAWINGS

Referring to the drawings which form a part of this disclosure.

DETAILED DESCRIPTION OF THE PREFERRED EMBODIMENTS

Figure 2:
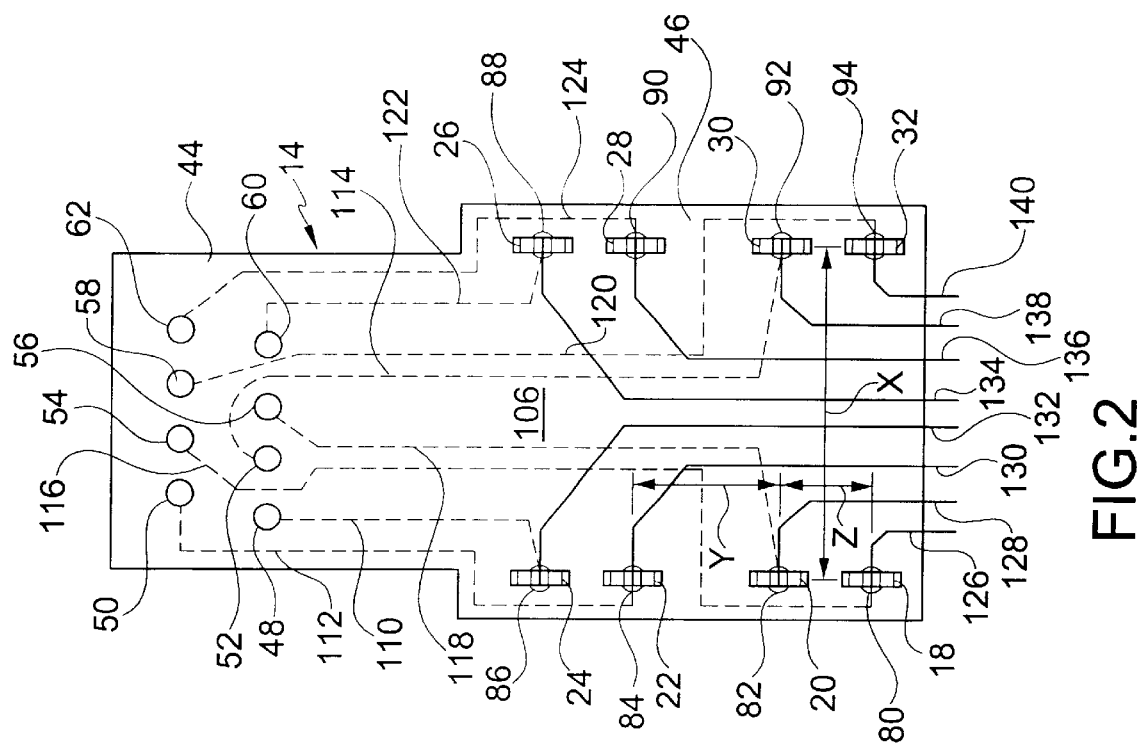
FIG. 2 is a diagrammatic top plan view of the wiring connecting unit for the electrical connector FIG. 1.
Figure 1:
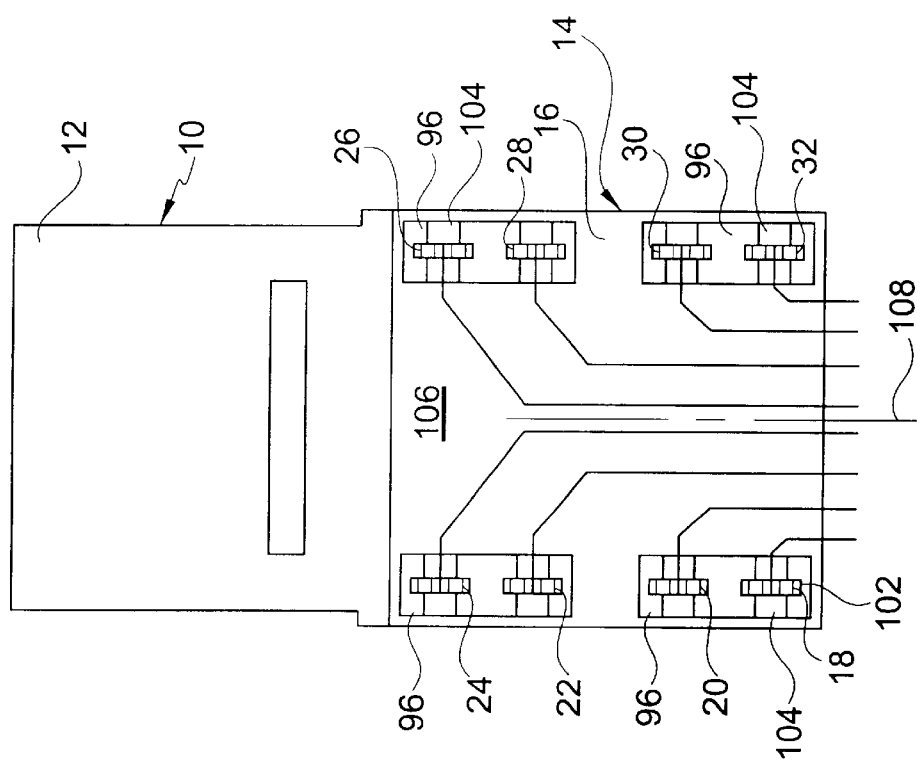
FIG. 1 is a diagrammatic top plan view of a high density jack for a telecommunication system according to the present invention.
Figure 3:
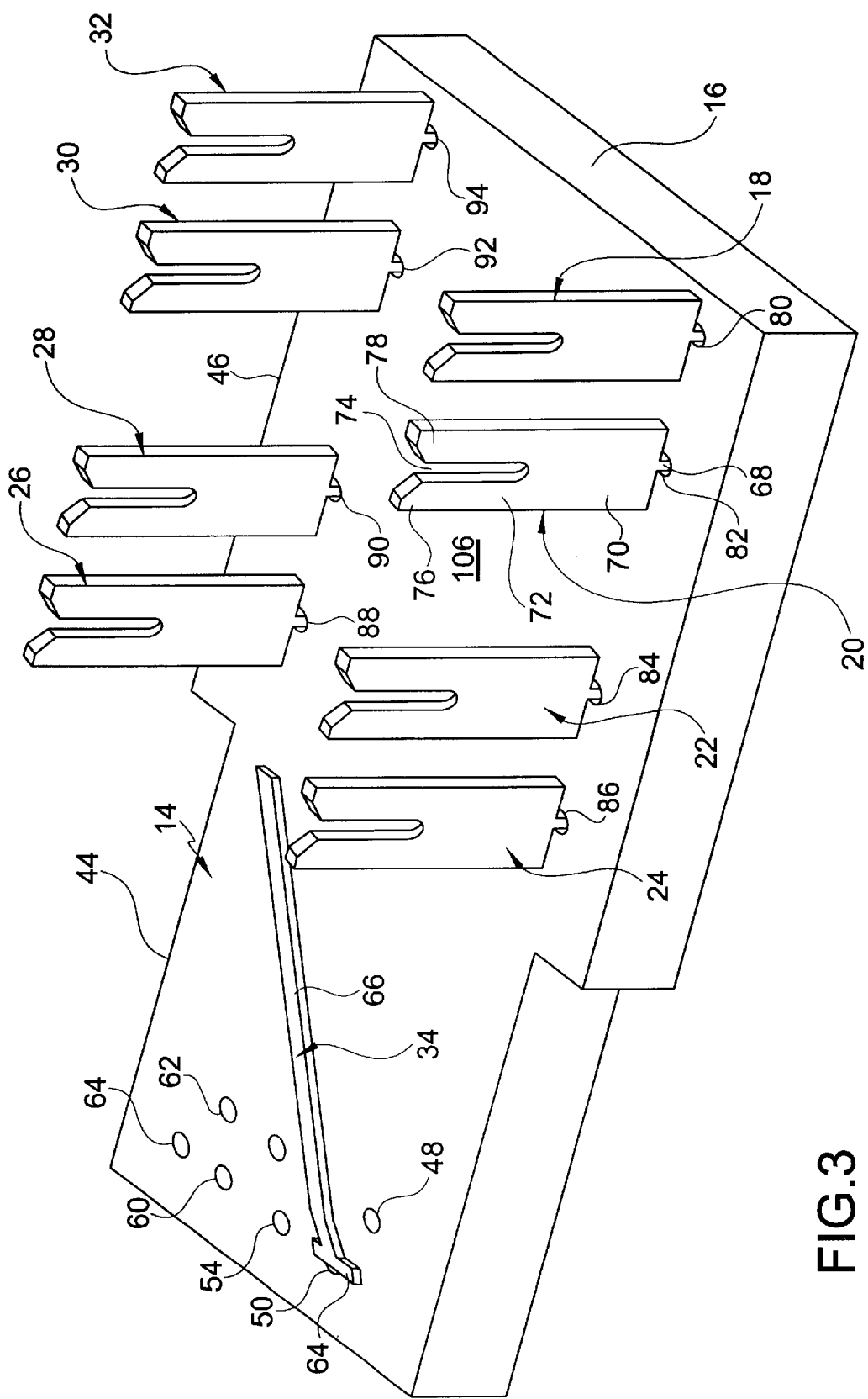
FIG. 3 is a perspective view of the wire connecting unit for the electrical connector of FIG. 1, with only some of the electrically conductive contacts mounted therein and without the insulating members for the terminals.

A high density jack 10 for telecommunication systems according to the present invention is schematically or diagrammatically illustrated in FIGS. 1–3. The connector comprises a connector body 12 and a wire connecting unit 14 coupled to the connector body. The wiring unit comprises a printed circuit board 16 on which four pairs of terminals 18, 20, 22, 24, 26, 28, 30 and 32 are mounted. Through the circuit board, these terminals are electrically and mechanically coupled to resilient contacts 34. The resilient contacts extend into the connector body in the standard configuration for electrical connection to a plug, particularly an RJ plug.

In the illustrated embodiment, connector body 12 is in a form to form a jack. However, the connector body can be of any desired form, such as a plug, cross connect or any other connector in the telecommunications or data transmission field.

Connector body 12 is generally hollow having a forwardly opening cavity for receiving a conventional RJ plug. Eight parallel slots extend through the connector body and open on its rear face. One resilient contact 34 is located in each of the slots.

The connector body also has a recess opening on the rear face of connector body 12. The recess is adapted to receive a portion of circuit board 16, specifically the portion of the circuit board on which the resilient contacts 34 are mounted. A shelf can extend rearwardly from the connector body below the recess. The shelf supports circuit board 16 and facilitates the coupling between the circuit board and the connector body.

Printed circuit board 16 is divided into a relatively narrower nose or first area 44 and a relatively wider termination or second area 46. Nose area 44 comprises eight holes or contact connections 48, 50, 52, 54, 56, 58, 60 and 62. Each of the holes is internally plated with an electrically conductive material, as conventionally done in this art. The holes can be arranged in two rows of four each, which rows are laterally offset from one another, as illustrated. Alternatively, the arrangement of the holes can be modified (e.g. using three rows) to accommodate higher frequencies. Each of the holes is provided for mounting one of the resilient contacts 34.

Each resilient contact 34 comprises a base portion 64 and a contact portion 66. The base portions are received and are electrically connected to the holes. The contact portions extend in a cantilever manner from the based portions and are bent at an angle for receipt within the slots of connector body 12. In this manner, the holes provide connections in the circuit board for the resilient contacts 34.

The terminals 18, 20, 22, 24, 26, 28, 30 and 32 are standard 110 insulation displacement contacts (IDC). Each terminal comprises a lower coupling portion 68, a middle portion 70 connected to and extending from the coupling portion and an insulation displacement contact portion 72 extending from the middle portion, such that middle portion connects the coupling portion and the contact portion. Each contact portion has a slot 74 to define legs 76 and 78.

The shape of the resilient contacts and the IDC terminals can be modified to enhance electrical performance.

To mount terminals 18, 20, 22, 24, 26, 28, 30 and 32 on circuit board 16, the circuit board is provided with respective openings or terminal connections 80, 82, 84, 86, 88, 90, 92 and 94. Specifically, terminal 18 is mounted in opening 80; terminal 20 is mounted in opening 82; terminal 22 is mounted in opening 84; terminal 24 is mounted in opening 86; terminal 26 is mounted in opening 88; terminal 28 is mounted in opening 90; terminal 30 is mounted in opening 92; and terminal 32 is mounted in opening 94.

Like the first area holes, the terminal area openings or terminal connections are internally plated with conductive material to mechanically and electrically engage coupling portion 68 of the respective terminal.

Each of the terminals, particularly the contact portions thereof, are generally planer. Additionally, the terminals are arranged in pairs with the terminals of each pair being coplanar. Specifically, terminals 18 and 20 form a first coplanar pair; terminals 22 and 24 form a second coplanar pair; terminals 26 and 28 form a third coplanar pair; and terminals 30 and 32 form a fourth coplanar pair.

To support and protect the terminals and to avoid inadvertent electrical contact, the middle portion and contact portion of each terminal are supported with one of four insulating members 96 extending upwardly from the surface of the circuit board. The upper portions of the insulating members can have upwardly and outwardly slanted surfaces to provide inlet areas tapering downwardly leading to the terminals. The sides of the terminals are located within slots 102 in the insulating members. Center slots 104 extend along at least a portion of the length of each insulating member to expose terminal legs 76 and 78 and terminal slot 74 for receiving a wire.

As illustrated in FIG. 1, four separate sets of insulating members are provided, with each member being provide for one pair of the terminals. The four insulating members define a wire receiving passageway 106. The twisted pairs of wires from the system wiring or cables are placed in and extend within passageway 106 for connection to respective terminals.

Passageway 106 extends along an axis 108. The passageway extends along its axis from the end of the circuit board remote from connector body 12 to the junction of nose and termination areas 44 and 46 of circuit board 16.

As illustrated in FIG. 2 contact connection holes 48, 50, 52, 54, 56, 58, 60 and 62 are electrically coupled to terminal connection openings 86, 84, 92, 80, 82, 94, 88 and 90, respectively, by conductive traces 110, 112, 114, 116, 118, 120, 122 and 124, respectively. Trace 110 extends between and electrically couples hole 48 and opening 86. Trace 112 extends between and electrically couples hole 50 and opening 84. Trace 114 extends between and electrically couples 52 and opening 92. Trace 116 extends between and electrically couples hole 54 and opening 80. Trace 118 extends between and electrically connects hole 56 and opening 82. Trace 120 extends between and electrically connects hole 58 and opening 94. Trace 122 extends between and electrically connects 60 and opening 88. Trace 124 extends between and electrically couples hole 62 and opening 90. In this manner, the traces connect the terminals to respective resilient contacts through the respective holes and openings.

The traces are only illustrated graphically and are not intended to depict a specific length, shape or relative orientation. The traces can be adapted to employ noise reduction techniques such as those disclosed in U.S. Pat. No. 5,432, 484 to Klas et al, U.S. Pat. No. 5,414,393 to Rose et al and U.S. Pat. No. 5,618,185 to Aekins, the subject matter of each patent is hereby incorporated by reference.

As illustrated in the figures, the terminals of each pair are oriented in a plane parallel to axis 108 of passageway 106.

In connecting wires 126, 128, 130, 132, 134, 136, 138 and 140 to terminals 18, 20, 22, 24, 26, 28, 30 and 32, respectively, each wire initially passes and is oriented along axis 108. The wire is then bent at obtuse angles for connection to the respective insulation displacement terminal. The system provides better electrical performance, facilitates manipulation of the wires for placing them within the appropriate respective terminal, and permits and facilitates visual inspection of the wiring connections.

According to the illustrated embodiment, each pair of terminals is equally spaced from axis 108. This facilitates the appropriate electrical balance for the system. Additionally, the first pair of terminals 18 and 20 and the second pair of terminals 22 and 24 are located on one side of the passageway 106, while the third pair of terminals 26 and 28 and the fourth pair of terminals 30 and 32 are located on the opposite side of the passageway. The second and third pair of terminals are located adjacent nose area 44, while first and fourth pair of terminals are located remote from nose area 44. The end of the passageway remote from the nose area is the region of wiring unit 14 through which the wires can be initially fed for connection to the terminals.

The terminals of each terminal pair have spacings between one another which are smaller than the spacings between the respective closest terminal pairs. The center-to-center spacing between the terminal connections of each terminal pair are substantial equal to distance Z. The spacing of the terminal connections of the two pairs of terminals on each side of passageway 106 are measured by substantially equal distances Y between the centers of the closest terminal connections of such pairs (82 and 84, or 90 and 92). The distance Y. is substantially greater than the distances X.

The terminal connections for the pairs (i.e., the first and fourth pairs and the second and third pairs) on opposite sides of passageway 106 are spaced by distance X measured between the centers of the directly opposite terminal connections (i.e., between terminal connections 80 and 94, 82 and 92, 84 and 90, 86 and 88). Distance X is substantially equal to the sum of distance Y and distance Z.

While a particular embodiment has been chosen to illustrate the invention, it will be understood by those skilled in the art that various changes and modifications can be made therein without departing from the scope of the invention as defined in the appended claims.

What is claimed is:

1. A wire connecting unit for an electrical connector, comprising:
   a printed circuit board having first and second areas and a wire receiving passageway extending along an axis in said second area;
   contact connections mounted in said first area;
   terminal connections mounted in said second area;
   conductive paths on said circuit board electrically coupling the respective contact connections and terminal connections; and
   first, second, third and fourth pairs of terminals, each of said terminals having a coupling portion mechanically and electrically connected to one of said terminal connections and having an insulation displacement contact portion, each said contact portion being adjacent said wire receiving passageway, said terminals of each of said pairs having spacings between one another smaller than spacings between the respective pairs to enhance electrical performance including near end cross talk and impedance performance, without shielding and without changing standard connector geometry and pin out definitions, and to facilitate wire installation.

2. A wire connecting unit according to claim 1 wherein
   said terminal connections for each said pair are substantially equally spaced by a first center-to-center distance;
   said terminal connections for said first and second pairs are located on one side of said passageway and are spaced by a second center-to-center distance, said second distance being substantially greater than said first distance; and
   said terminal connections for said third and fourth pairs are located on another side of said passageway and are spaced substantially by said second distance.

3. A wire connecting unit according to claim 2 wherein
   said terminal connections for said first and fourth pairs are spaced substantially by a center-to-center third distance; and
   said terminal connections for said second and third pairs are spaced substantially by said third distance, said third distance being substantially equal to a sum of said first and second distances.

4. A wire connecting unit according to claim 2 wherein
   said contact portions of each said pair are essentially coplanar and oriented in planes parallel to said axis.

5. A wire connecting unit according to claim 4 wherein
   said wire receiving passageway has a first longitudinal end adjacent said first area and a second longitudinal end remote from said first area through which wires can be initially fed;
   said second and third pairs are located adjacent said first end; and
   said first and fourth pairs are located adjacent said second end.

6. A wire connecting unit according to claim 5 wherein
   each of said pair are located substantially equally distant from said axis.

7. A wire connecting unit according to claim 1 wherein
   said contact portions are housed in insulating members extending from a surface of said circuit board.

8. A wire receiving unit according to claim 6 wherein
   said insulating members define said wire receiving passageway therebetween.

9. A wire receiving unit according to claim 1 wherein
   electrically conductive contacts are coupled to and extend from said contact connections.

10. An electrical connector, comprising:
    a connector body;
    a printed circuit board, coupled to said connector body, and having first and second areas and a wire receiving passageway extending along an axis in said second area;
    contact connections mounted in said first area;
    terminal connections mounted in said second area;
    conductive paths on said circuit board electrically coupling the respective contact connections and terminals connections; and
    first, second, third and fourth pairs of terminals, each of said terminals having a coupling portion mechanically and electrically connected to one of said terminal connections and having an insulation displacement contact portion, each said contact portion being adjacent said wire receiving passageway, said terminals of each of said pairs having spacings between one another smaller than spacings between the respective pairs to enhance electrical performance including near end cross talk and impedance performance, without shielding and without changing standard connector geometry and pin out definitions, and to facilitate wire installation.

11. An electrical connector according to claim 10
    said terminal connections for each said pair are substantially equally spaced by a first center-to-center distance;
    said terminal connections for said first and second pairs are located on one side of said passageway and are spaced by a second center-to-center distance, said second distance being substantially greater than said first distance; and
    said terminal connections for said third and fourth pairs are located on another side of said passageway and are spaced substantially by said second distance.

12. An electrical connector according to claim 11 said terminal connections for said first and fourth pairs are spaced substantially by a center-to-center third distance; and said terminal connections for said second and third pairs are spaced substantially by said third distance, said third distance being substantially equal to a center-to-center sum of said first and second distances.

13. An electrical connector according to claim 10 wherein said contact portions of each said pair are essentially coplanar and oriented in planes parallel to said axis.

14. An electrical connection according to claim 13 wherein said wire receiving passageway has a first longitudinal end adjacent said first area and a second longitudinal end remote from said first area through which wires can be initially fed;

said second and third pairs are located adjacent said first end; and said first and fourth pairs are located adjacent said second end.

15. An electrical connector according to claim 14 wherein each of said pair are located substantially equally distant from said axis.

16. An electrical connector according to claim 10 wherein said contact portions are housed in insulating members extending from a surface of said circuit board.

17. An electrical connector according to claim 16 wherein said insulating members define said wire receiving passageway therebetween.

18. An electrical connector according to claim 10 wherein electrically conductive contacts are coupled to an extend from said contact terminals into said connector body.

19. A wire connecting unit for an electrical connector, comprising:

a printed circuit board having first and second areas and a wire receiving passageway extending along an axis in said second area;

contact connections mounted in said first area;

terminal connections mounted in said second area;

conductive paths on said circuit board electrically coupling the respective contact connections and terminal connections;

first, second, third and fourth pairs of terminals, each of said terminals having a coupling portion mechanically and electrically connected to one of said terminal connections and having an insulation displacement contact portion, each said contact portion being adjacent said wire receiving passageway, said terminals of each of said pairs having spacings between one another smaller than spacings between the respective pairs;

said terminal connections for each said pair being substantially equally spaced by a first center-to-center distance;

said terminal connections for said first and second pairs being located on one side of said passageway and spaced by a second center-to-center distance, said second distance being substantially greater than said first distance;

said terminal connections for said third and fourth pairs being located on another side of said passageway and spaced substantially by said second distance;

said terminal connections for said first and fourth pairs being spaced substantially by a third center-to-center distance; and said terminal connections for said second and third pairs being spaced substantially by said third distance, said third distance being substantially equal to a sum of said first and second distances.

20. An electrical connector, comprising:

a connector body;

a printed circuit board, coupled to said connector body, and having first and second areas and a wire receiving passageway extending along an axis in said second area;

contact connections mounted in said first area;

terminal connections mounted in said second area;

conductive paths on said circuit board electrically coupling the respective contact connections and terminals connections;

first, second, third and fourth pairs of terminals, each of said terminals having a coupled portion mechanically and electrically connected to one of said terminal connections and having an insulation displacement contact portion, each said contact portion being adjacent said wire receiving passageway, said terminals of each of said pairs having spacings between one another smaller than spacings between the respective pairs;

said terminal connections for each said pair being substantially equally spaced by a first center-to-center distance;

said terminal connections for said first and second pairs being located on one side of said passageway and spaced by a second center-to-center distance, said second distance being substantially greater than said first distance;

said terminal connections for said third and fourth pairs being located on another side of said passageway and spaced substantially by said second distance;

said terminal connections for said first and fourth pairs being spaced substantially by a third center-to-center distance; and said terminal connections for said second and third pairs being spaced substantially by said third distance, said third distance being substantially equal to a sum or said first and second distances.

* * * * *